United States Patent [19]

Watt

[11] Patent Number: 5,745,335
[45] Date of Patent: Apr. 28, 1998

[54] MULTI-LAYER FILM CAPACITOR STRUCTURES AND METHOD

[75] Inventor: Michael Man-Kuen Watt, North York, Canada

[73] Assignee: Gennum Corporation, Burlington, Ontario, Canada

[21] Appl. No.: 671,057

[22] Filed: Jun. 27, 1996

[51] Int. Cl.⁶ .................. H01G 4/06; H01G 4/228
[52] U.S. Cl. .............. 361/313; 361/306.1; 361/306.3; 361/308.1; 361/329; 361/321.4; 361/321.5
[58] Field of Search ................ 361/301.4, 303, 361/306.1, 306.3, 307, 308.1, 308.3, 312–313, 321.1–321.5, 322, 328–330; 29/25.42; 257/295, 306–310

[56] References Cited

U.S. PATENT DOCUMENTS

| 4,470,099 | 9/1984 | Sawairi | 361/328 |
| 4,914,546 | 4/1990 | Alter | 361/313 |
| 5,191,510 | 3/1993 | Huffman | 361/313 |
| 5,206,788 | 4/1993 | Larson et al. | 361/313 |
| 5,367,430 | 11/1994 | DeVoe et al. | 361/328 |
| 5,414,588 | 5/1995 | Barbee, Jr. et al. | 361/304 |
| 5,457,598 | 10/1995 | Radford et al. | 361/321 |
| 5,486,277 | 1/1996 | Barbee, Jr. et al. | 204/192 |

FOREIGN PATENT DOCUMENTS

| 1087444-A | 6/1994 | China . |
| 3-012909 | 1/1991 | Japan . |
| 4-207011 | 7/1992 | Japan . |
| 6-013258 | 1/1994 | Japan . |
| 6-231991 | 8/1994 | Japan . |
| 6-342736 | 12/1994 | Japan . |
| 7-045786 | 2/1995 | Japan . |
| 7-245232 | 9/1995 | Japan . |
| 7-283076 | 10/1995 | Japan . |

Primary Examiner—Bot L. Ledynh
Attorney, Agent, or Firm—Bereskin & Parr

[57] ABSTRACT

A multi-layer film capacitor structure has a bottom electrode layer on a monolithic substrate, intermediate pairs of layers of film electrode and dielectric material overlying the bottom electrode, and a top pair of layers of a film electrode and film dielectric overlying the intermediate pairs. The structure preferably has a mesa configuration, in which each electrode layer extends laterally beyond the periphery of the layers above it around the entire periphery of the device. Each electrode layer therefore has a top surface which is accessible at its projecting edge through a via, so that the electrodes can be accessed in any combination to permit any desired circuit connection. If desired the dielectric materials can have different frequency characteristics, allowing a single capacitor structure to be optimized for a filter. Either the bottom electrode or the top electrode or both can be grounded and capacitor connections can be made to intermediate layers, to reduce parasitic capacitance effects.

17 Claims, 11 Drawing Sheets

MULTI-LAYER FILM CAPACITOR STRUCTURES AND METHOD

FIELD OF THE INVENTION

This invention relates to multi-layer film capacitor structures, and to methods for forming the same.

BACKGROUND OF THE INVENTION

In the circuit fabrication there is a need for small, reliable capacitor structures which can be made in integrated form, commonly as part of an integrated circuit.

A typical prior art multi-layer capacitor is shown in U.S. Pat. No. 5,367,430 issued Nov. 22, 1994. This patent discloses a multilayer capacitor made by interspersing layers of green tape containing ceramic powder in a binder with printed layers of electrical conductors. Connections are then made to the edges of the conducting layers to provide external connections. A problem with the capacitor structure shown in this patent is that it cannot readily be integrated, and in addition connection to the edge layers is mechanically difficult and is time consuming.

Another form of multi-layer capacitor is shown in U.S. Pat. No. 5,206,788 issued Apr. 27, 1993. This patent shows a ferroelectric capacitor having bottom and top electrodes, with a number of alternating layers of ferroelectric material and electrodes between the top and bottom electrodes. The purpose of this patent is to reduce the defect rate in capacitors used for memory devices. The capacitor shown in this patent is formed by a series of deposition steps, of the kind used in forming integrated circuits, but since the layers are so thin, there is no way to form connections to the intermediate layers and there is no suggestion that any such connections should be formed.

BRIEF SUMMARY OF THE INVENTION

It is therefore an object of the present invention, in one of its aspects, to provide an improved film capacitor structure which allows for simple access to any of a number of electrodes or combination of electrodes. In one of its aspects the invention provides a multi-layer capacitance structure comprising:

(a) a bottom film electrode layer overlying a substrate, (b) at least one pair of intermediate layers of a film electrode and a film dielectric material overlying said bottom electrode, (c) a top pair of layers of a film electrode and a film dielectric material overlying the uppermost pair of intermediate layers, (d) said bottom electrode having a connection portion extending laterally beyond the intermediate layers, said connection portion having a first upper surface, said first upper surface including means adapted to be connected to a circuit, (e) at least one electrode of said intermediate layers having a connection portion extending laterally beyond the layers above it, said connection portion having a second upper surface, said second upper surface including means adapted to be connected to a circuit, (f) said top electrode layer having a third upper surface, said third upper surface including means adapted to be connected to a circuit, (g) said layers being arranged in a mesa structure, so that at least one pair of intermediate layers extends laterally beyond said top layers around the entire periphery of said tip layers, and said bottom electrode extends laterally beyond said at least one pair of intermediate layers around the entire periphery of said intermediate layers.

In another aspect the invention provides a method for reducing the variation of capacitance with voltage of a ferroelectric film capacitor having first and second electrodes each of a first selected area with a dielectric layer between them, comprising: forming a multi-layer film capacitor structure having a plurality of film layers of dielectric material alternating with a plurality of film electrode layers to form a monolithic structure comprising a stack of capacitors arranged substantially in series, each of said electrode layers having a further selected area, each further selected area being larger than said first selected area by a factor which is approximately equal to the number of said electrode layers of said multi-layer film capacitor structure minus 1.

In another aspect the invention provides a method of increasing the voltage at which significant leakage currents begin to occur in a capacitor, said method comprising a method of increasing the voltage at which significant leakage current begins to flow in a ferroelectric film capacitor having first and second electrodes each of a first selected area with a dielectric layer between them, comprising: forming a multi-layer film capacitor structure having a plurality of film layers of dielectric material alternating with a plurality of film electrode layers to form a monolithic structure comprising a stack of capacitors arranged substantially in series, each of said electrode layers having a further selected area, each further selected area being larger than said first selected area by a factor which is approximately equal to the number of said electrode layers of said multi-layer film capacitor structure minus 1.

In yet another aspect the invention provides a method of providing a capacitor in which the main capacitance element or elements which determine the capacitance of the structure are relatively isolated from disturbing influences. In this aspect the invention provides a monolithic multi-layer film capacitor structure comprising a plurality of film layers of dielectric material alternating with a plurality of film electrode layers to form a monolithic structure comprising a stack of capacitors arranged electrically in series, said capacitors comprising a lower capacitor, an upper capacitor, and an intermediate capacitor between said lower and upper capacitors, said intermediate capacitor being of substantially smaller capacitance value than said upper and lower capacitors and being protected from environmental influences by said upper and lower capacitors, said upper, lower and intermediate capacitors being arranged in series with said upper and lower capacitors including means adapted to be connected to a circuit.

Further objects and advantages of the invention will appear from the following description, taken together with the accompanying drawings.

BRIEF DESCRIPTION OF THE DRAWINGS

In the accompanying drawings:

FIG. 8b is a plot showing capacitance versus frequency for the capacitance structure of FIG. 8a;

FIG. 18b is a side view of the capacitance structure of FIG. 18a.

DETAILED DESCRIPTION OF PREFERRED EMBODIMENTS

Figure 1:
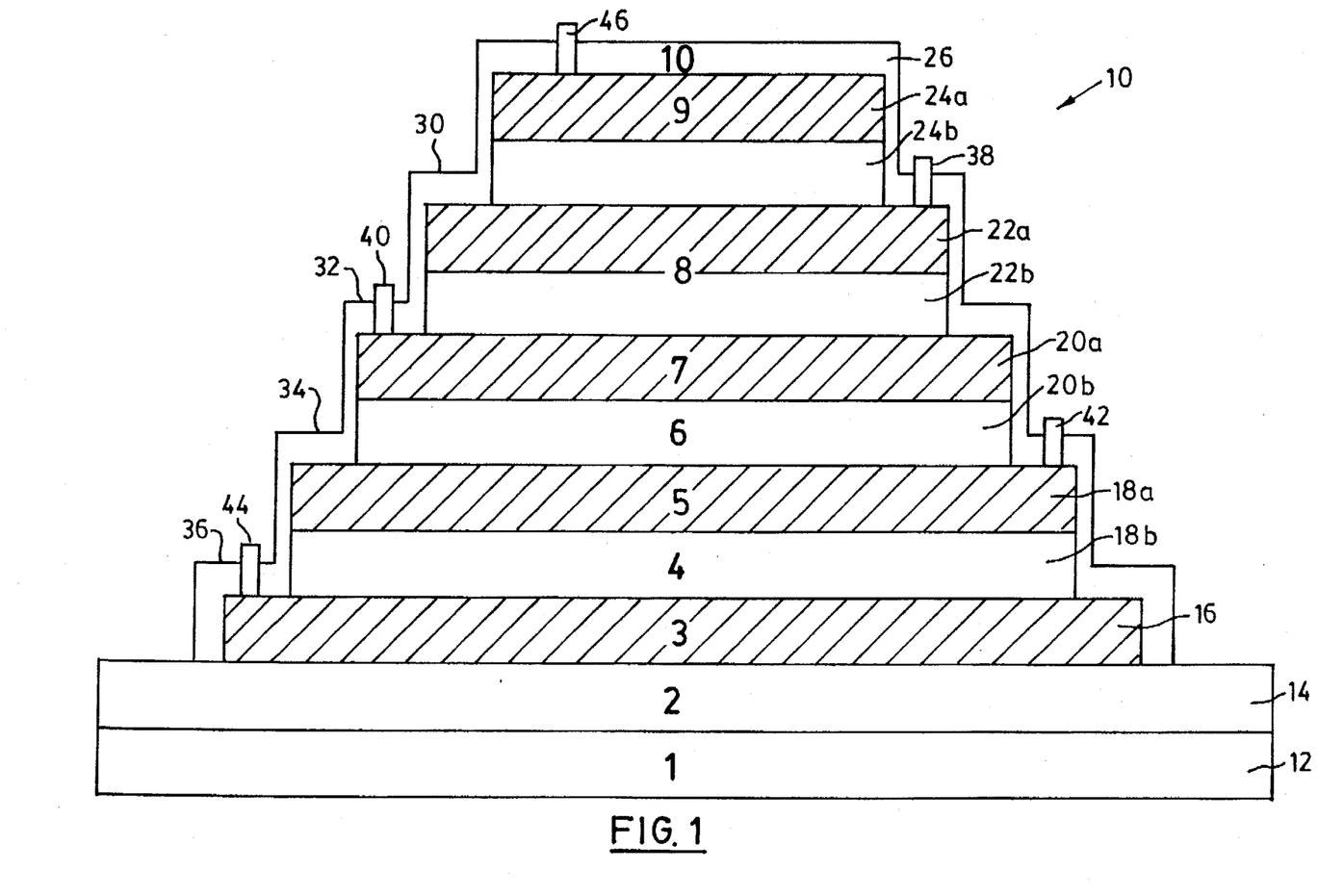
FIG. 1 is a diagrammatic side sectional view of a multi-layer capacitance structure according to the invention.
Figure 2:
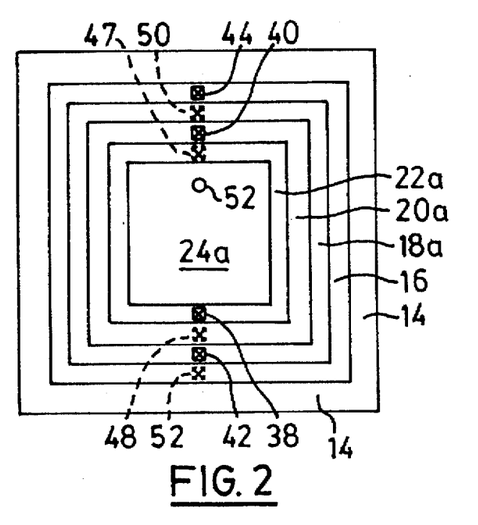
FIG. 2 is a top view of the capacitance structure of FIG. 1 but with the covering dielectric layer removed.

Reference is first made to FIGS. 1 and 2, which show a preferred embodiment of a multi-layer capacitance structure 10 according to the invention. The structure 10 includes a conventional substrate 12 (e.g. of silicon or any other suitable material) covered by a layer of insulation 14 (e.g. of silicon dioxide or any other suitable insulator material). Atop the insulation layer 14 is a conventional bottom electrode 16, formed of any suitable metal (e.g. nickel, platinum or palladium).

Above bottom electrode 16 are successive pairs of intermediate electrode layers/dielectric layers 18a, 18b, 20a, 20b, and 22a, 22b. Above the upper intermediate layers 22a, 22b are top layers 24a, 24b (layer 24a being an electrode layer and layer 24b being a dielectric layer). All of the electrode and dielectric layers shown are film layers, deposited by conventional techniques such as sputtering, chemical vapor deposition, evaporation, or spin-on techniques, all of which are well-known in the art. The intermediate and top electrode layers are, like the bottom electrode 16, of any suitable metal such as platinum and/or palladium. The dielectric layers are of any desired suitable material. One class of materials which has been found to be particularly suitable is the class known as ferroelectric materials, also called polar dielectric materials, such as those disclosed in U.S. Pat. No. 5,206,788 and which are well-known in the art for capacitors. Examples of ferroelectric or polar dielectric materials are lead zirconate titanate compositions. As is well known ferroelectric (polar) dielectric materials exhibit spontaneous polarization at temperatures below their Curie temperature.

In FIG. 1 the vertical thicknesses are much exaggerated. The electrode and dielectric layers are all film layers with very small thicknesses, typically in the order of 0.03 to 1.0 μm, although they can be thicker if desired.

As shown, the layers 16 and 18a, 18b to 24a, 24b are arranged in a mesa structure. In a mesa structure the pairs of layers become progressively larger from top to bottom, so that the top surface of each lower layer pair is larger than the bottom surface of each layer above it and extends laterally beyond the layer above it in all horizontal dimensions.

After the mesa structure of electrode and dielectric layers has been formed, the entire structure is covered with a layer of insulation 26, again typically silicon dioxide (shown in FIG. 1 but omitted in FIG. 2 for clarity). Since the insulation layer 26 follows the stepped pattern of the mesa, the insulation layer 26 defines a set of annular horizontal surfaces 30, 32, 34, 36 over the projecting edges of each electrode layer 16, 18a, 20a, 22a. Windows or vias are opened in the horizontal annular surfaces 30 to 36 through which contacts 38, 40, 42, 44 are established (typically of gold or other suitable conductive material) to the electrodes described.

The width of the annular horizontal surfaces 30 to 36 is typically between one and ten μm, which is sufficient to make the electrical contacts shown. (Typically the contact will occupy between half and two-thirds of the width of the ledge on which it is located.) If desired, and as shown in dotted lines, additional electrical contacts 46, 48, 50, 42 may be made to each intermediate electrode layer, so that in a given application, the best located connection to any given electrode may be used, for greater convenience in fabrication of the circuit package in question. A top electric contact is also made to the top electrode 24a.

Figure 2A:
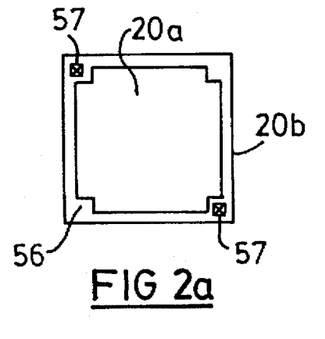
FIG. 2a is a top view of a modified pair of dielectric and electrode layers.

In addition, if desired, each dielectric layer may have inset areas to facilitate making contact to the electrode larger below it. This is shown in FIG. 2a, which shows one dielectric layer 20a and its associated electrode layer 20b. Dielectric layer 20a has inset corners 55 which expose widened ledge areas 56 on the electrode layer 20b, for contacts 57. Such widened ledge areas can also be exposed at other locations along the periphery of each electrode layer.

With the structure shown in FIGS. 1, 2 and 2a, independent and optional access is permitted to any desired combination of capacitor electrode layers, at more than one position for each layer, resulting in customization flexibility, optimization of parametric and reliability performance of each capacitor structure, and production efficiency. While three pairs of intermediate electrode/dielectric layers have been shown, it will be realized that any desired number of intermediate layers can be provided. In addition the mesa can be of any shape, e.g. square, rectangular, round, elliptical, or L-shaped. A further advantage of the mesa structure with contacts at the exposed edges is that it is not necessary to have openings through dielectric layers, which could cause defects and adhesion problems.

Figure 3:
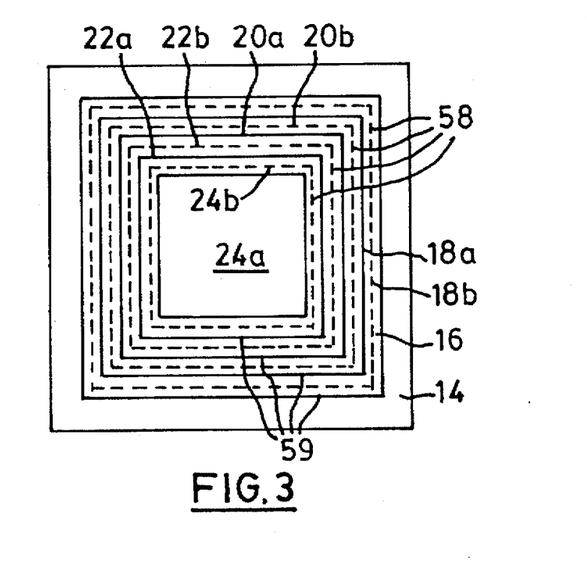
FIG. 3 is a top view similar to FIG. 2 but illustrating manufacturing tolerances.

It will be realized that when layers of film, particularly thin film, are stacked, it can be difficult to maintain the integrity and accuracy of the film edges. However with a mesa structure a greater tolerance can be permitted than with a stacked structure having vertically coincident edges. Thus, as shown in FIG. 3, the outer lateral edges 58 of the dielectric layers can occur at any location between the outer lateral edges 59 of the electrode layers on each side of the dielectric layer in question, thereby providing a substantial degree of manufacturing tolerance, with less risk of overhanging edges.

In addition, when stepped (i.e. staircase pattern) edges are provided, as shown in FIG. 1, there is less likelihood that excessively high vertical edges will be formed which are difficult for the thin film insulation layer 26 (or a thin film interlayer dielectric) to cover.

Preferred Method of Fabrication

There are two general types of fabrication methods well known for film device structures. These methods are top-down and bottom-up fabrication. Top-down fabrication involves the deposition of a number of blanket film layers on a substrate, in sufficient number to make up the layers of the structure. Top-down patterning, using masks and etching, is then used to define the patterning of different layers. FIGS. 4a to 4e show top-down patterning used to produce the mesa structure of FIGS. 1 and 2.

Figure 4A:
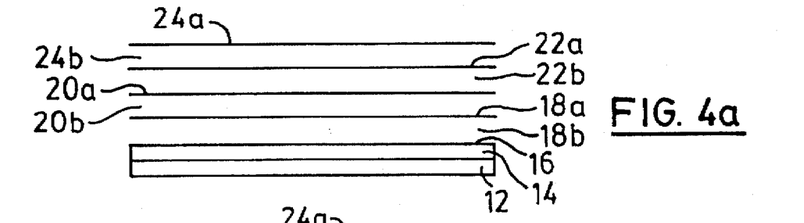
FIGS. 4a to 4e are diagrammatic views showing production of a capacitance structure according to the invention by top-down patterning.
Figure 4B:
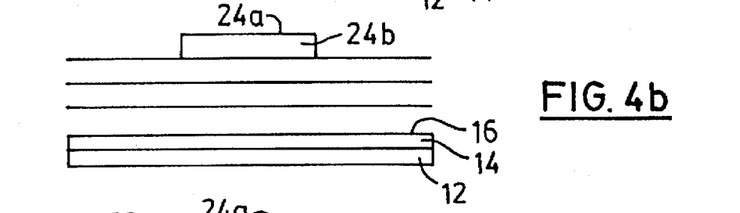

As shown in FIG. 4a, the electrodes and dielectric layers 18a, 18b to 24a, 24b are deposited in an unpatterned blanket structure 60 on the insulation layer 14 on the substrate 12. FIG. 4b shows the top electrode and dielectric layers 24a, 24b as being patterned (by known masking and etching techniques, as indicated).

Figure 4C:
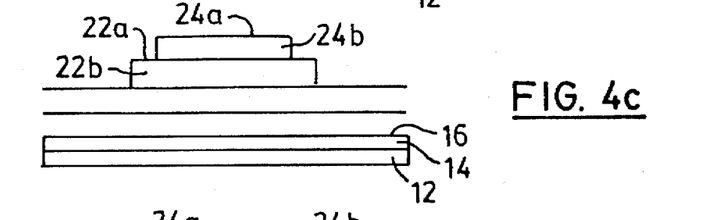
Figure 4D:
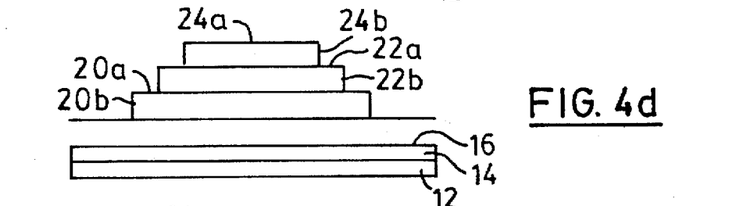
Figure 4E:
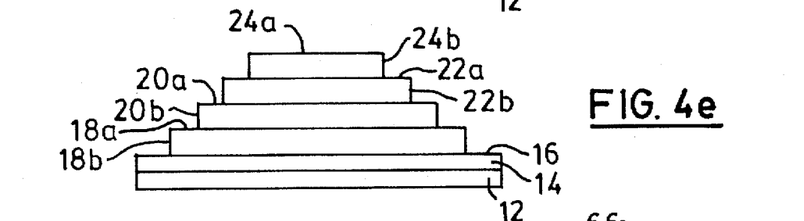

FIGS. 4c to 4e show successive patterning of successively lower layers of electrode and dielectric, until the next to final mesa structure 62 is achieved (FIG. 4e). After the bottom electrode 16 is patterned (not shown), the covering insulation layer 26 (not shown in FIG. 4e) is added.

It will be realized that with top-down patterning, it is not possible to pattern a lower layer to exclude area that exists in the pattern of any upper layer. This is not a problem when a mesa structure is used. In addition, when etching is performed on a layer of a mesa structure, all sides of the layer receive equal treatment, improving the predictability of the resultant structure.

Bottom-up fabrication builds a device structure one layer at a time, starting with the formation of the bottom layer. Several bottom-up fabrication methods are known. In one method, a layer can be fabricated by laying down a blanket and then patterning over it to subtract away undesired blanket material, after which the next layer is added. Alternatively, using a selective pattern deposition method, a lift-off or shadow mask can be used to form selectively the desired pattern of film on the substrate. In this method a lift-off mask is present on the substrate when the film is deposited; then the lift-off mask is removed, leaving the patterned film behind. The mesa structure as shown in FIGS. 1 and 2 can be fabricated using either top-down or bottom-up fabrication methods, but using top-down fabrication allows several important manufacturing advantages.

A major advantage of top-down fabrication, which is ideally suited for a mesa structure, is that top-down fabrication occurs under conditions of topographical and chemical homogeneity. Since the structure does not have to be patterned as it is being laid down, each successive blanket film layer can be formed over an identical surface of a previous layer with uniform topographical and chemical properties. As a result, there are no lateral variations or transition regions present which can cause material incompatibilities. In the case of bottom-up fabrication, a film which nucleates and grows on two regions of a substrate having distinct topographical and chemical characteristics, may develop different properties over the different regions.

In addition, the absence of topographical inhomogeneity in top-down construction (preferred for the mesa structure described) can also prevent the occurrence of film stresses and defects at transition edges and corners where deposited layers may be thinly formed.

Figure 5:
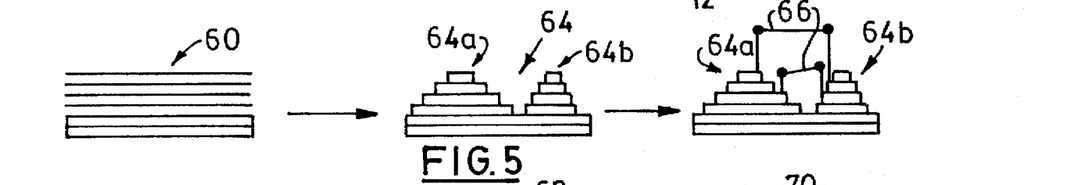
FIG. 5 shows a sequence of product manufacturing steps from production of an unpatterned blanket structure to production of a custom mesa structure to production of a custom wired product.

Another advantage of top-down fabrication is that after unpatterned blanket layers have been deposited as shown in FIG. 4a, producing the standard blanket structure 60, custom mesas can be fabricated therefrom as desired. One example of this is shown in FIG. 5, where the unpatterned blanket structure 60, which can be a stock item, is shown. The unpatterned blanket structure 60 is then formed into a custom mesa array 64, having (in the example shown) two mesa structures 64a, 64b. The mesa structures 64a, 64b can then be wired as indicated at 66 to form a custom product.

Figure 6:
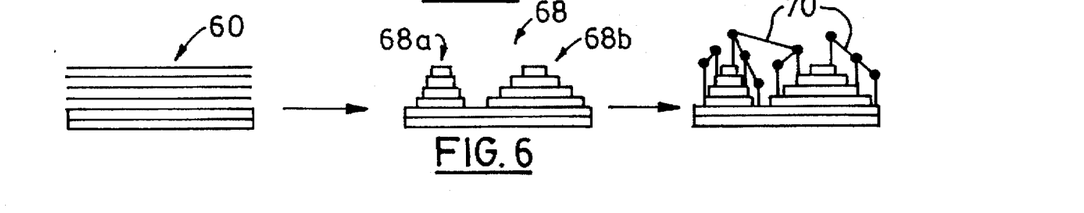
FIG. 6 shows a sequence of product manufacturing steps from an unpatterned blanket structure to production of a stock mesa structure to production of a custom wire product.

Alternatively, and as shown in FIG. 6, an unpatterned stock blanket structure 60 can be used to produce a stock mesa array 68, again having (in the example shown) two mesa structures 68a, 68b. The mesa array 68 can serve as a stock item, to be wired according to customer needs, with typical customized interconnect wiring being shown at 70 in FIG. 6.

The ability to produce stock mesa array forms, or to semi-customize them initially, can allow for shortened manufacturing lead time, and reduced inventory costs, resulting in improved efficiencies.

Even if bottom-up fabrication is used, nevertheless when a mesa structure is used, all electrode and dielectric layers of the structure are formed over flat surfaces of the previous layer and are not formed over any topographical (vertical) steps. This is a significant advantage of the mesa structure, because since thin films require nucleation on depositing surfaces, it is more effective to deposit layers on a flat (horizontal) surface than over topographical steps. With the mesa structure, only the protective or overcoat insulation layer 26 need be formed over topographical steps. Therefore, the resultant structure has a lower likelihood of chemical, mechanical and physical inhomogeneities than would occur if the layers were fabricated over a more varied topography.

It will also be realized that the arrangement described provides great versatility, in that because of the ready access to each layer, different interconnect schemes can be used for different capacitors on the same substrate. Thus, some capacitors on the substrate can be optimized for one purpose, and others can be optimized for other purposes. Some of these purposes will be described in the remainder of this description.

Further Applications and Embodiments

Figure 7A:
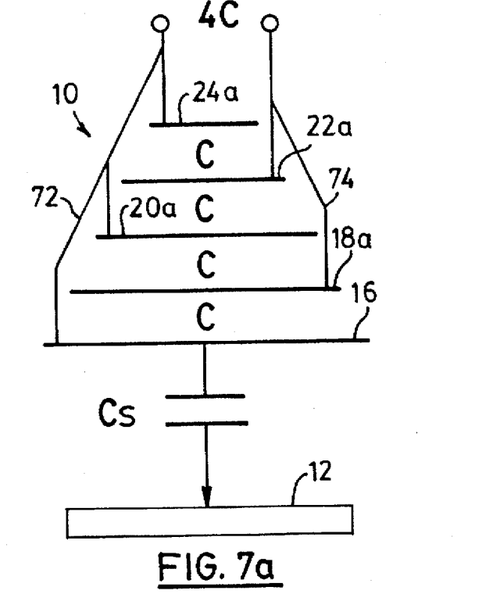
FIGS. 7a and 7b show respectively a capacitance structure according to the invention, and a prior art capacitor, and show the parasitic capacitance between the bottom electrode and the substrate conductor.
Figure 7B:
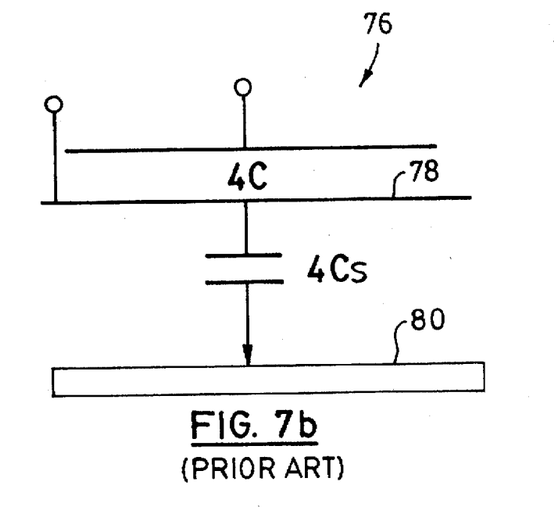

Reference is next made to FIGS. 7a and 7b, which show the effect of parasitic capacitance between the bottom electrode 16 and the substrate 12. FIG. 7a shows three alternating electrodes 16, 20a, 24a connected together at 72 and two alternating electrodes 18a, 22a connected together at 74 to form a parallel set of four parallel connected capacitors, each of capacitance C. (In fact, because of the differing areas of the layers, the capacitance values of each capacitor may not be the same, but they can be made the same by varying the thicknesses or proportions of the dielectric layers.) The parasitic capacitance between the bottom electrode 16 and the substrate 12 is indicated as $C_S$.

FIG. 7b shows a single layer capacitor 76, also having capacitance 4C. In capacitor 76 the area of the bottom electrode 78 must typically be approximately four times the size of bottom electrode 16 of FIG. 7a. Therefore the parasitic capacitance between electrode 78 and its substrate 80 is $4C_S$, which is four times higher than that of FIG. 7a.

Reference is next made to FIG. 8a, which again shows the multi-layer capacitance structure 10 having a mesa form, and having its five electrode layers connected to form four capacitances in parallel, namely capacitances A, B, C and D. The dielectric layers 18b, 20b, 22b, 24b between the respective sets of plates are made to differ from each other in their response to the frequency of the applied electric field. It is well-known that the dielectric constant of many known dielectric materials varies with frequency, and typically drops off sharply as the frequency increases beyond a rolloff frequency (when the frequency is higher than such rolloff frequency, the material is unable to store additional energy). Examples of materials which display this characteristic include members of the lead zirconate titanate (PZT) family, members of the barium strontium titanate (BST) family, silicon dioxide, and silicon nitride.

Figure 8A:
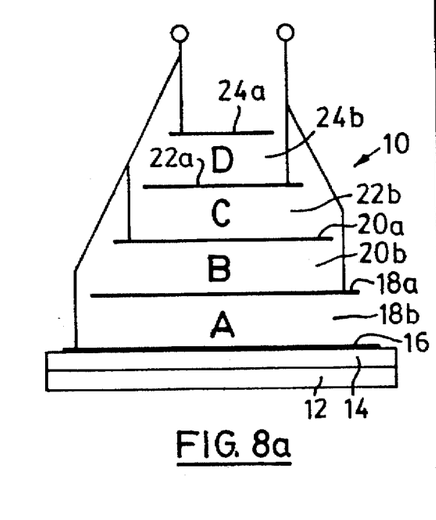
FIG. 8a is a diagrammatic view of a multi-layer capacitance structure of the kind shown in FIG. 1 but with different characteristic dielectric layers between each conductor layer.
Figure 8B:
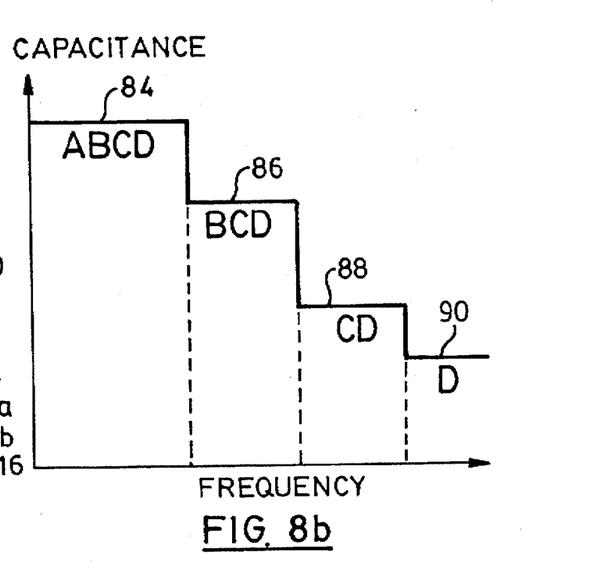

In the FIG. 8a example, it is assumed that the dielectric constant of dielectric layer 18b rolls off first at high frequency, and that the dielectric constants of layers 20b, 22b and 24b roll off successively as the frequency increases. In that case, the capacitance versus frequency plot will be as shown in FIG. 8b, where line segment 84 indicates the total capacitance when none of capacitances A, B, C, D has rolled off; line segment 86 indicates the total capacitance when capacitance A has rolled off sharply to a low level; line segment 88 indicates the total capacitance when capacitance B has rolled off sharply to a low level, and line segment 90 indicates the total capacitance when only dielectric layer 24b is functioning effectively. For illustrative purposes the rolloffs are shown as being sharp, but they will normally have a slope dependent on the material used. The thicknesses of the dielectric layers can also be made different from each other to further vary the characteristics of each capacitor layer (e.g. so that they have different capacitances). Each capacitor A, B, C, D can itself be a multi-layer stack, and the number of layers can vary in each.

The structure shown in FIG. 8a, with dielectric layers of different frequency characteristics, is useful in various applications, for example in filters. While capacitor combinations having varying responses to frequency have been soldered together to provide a capacitance versus frequency characteristic generally similar to that shown in FIG. 8b, this has never previously been achieved in a single monolithic structure in which the dielectric characteristics and/or thicknesses of various layers are varied to achieve the desired combination of capacitance values and frequency characteristics.

One practical requirement of the FIG. 8a embodiment is that it requires fabrication of dielectric film layers of different compositions and properties in close association with each other. The annealing temperature must therefore be adapted to accommodate the most temperature sensitive layer of material. If necessary, the FIG. 8a capacitance structure can be fabricated by a bottom-up technique, in which the bottom layers are those which require the highest temperature annealing and are laid down first. Layers which require and will withstand only lower temperature annealing can then be laid down above the higher annealing temperature layers and annealed after the higher temperature layers have been annealed.

Figure 9:
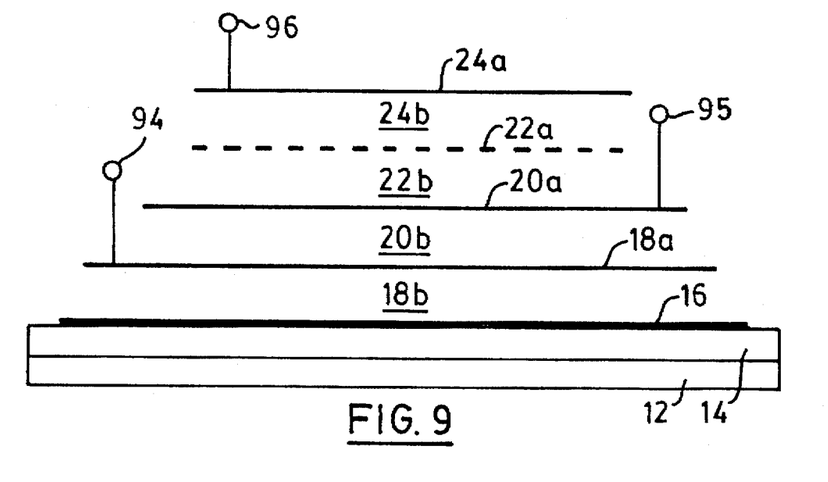
FIG. 9 is a diagrammatic view of the capacitance structure of FIGS. 1 and 2, but with the bottom electrode not connected.

Reference is next made to FIG. 9, which shows an application of the invention directed at creating a capacitance value of improved accuracy. In the FIG. 1 embodiment, the bottom electrode 16 must be deposited on another material, namely insulating material 14. The adhesion layer between the two substances creates interactions which may compromise the performance of the bottom electrode 16, since they are all relatively thin films. This can compromise layer to layer consistency, and also predictability in parametric and reliability performance. FIG. 9 deals with this problem by in effect circumventing the bottom electrode 16 and the first dielectric layer 18b, by connecting instead to the second electrode layer 18a as indicated at connection 94. No circuit connection is made to bottom electrode 16, and if desired (and as shown), no via is provided to allow any connection to electrode 16. It is assumed that the second electrode 18a has adequate adhesion on the first dielectric layer 18b and has a favorable microstructure which is only weakly dependent on the first dielectric layer 18b. In any event, the microstructure of the second electrode 18a will influence that of the subsequently formed dielectric layer 20b in a way that can be repeated in successive layers (travelling upwardly) in the multi-layer structure, with anomalies in the first electrode 16 and the first dielectric layer 18b being essentially circumvented by not connecting to them.

In the FIG. 9 embodiment, any connections to the various layers except for bottom electrode 16 may be made. Two exemplary other connections are shown at 95 and 96.

Figure 10:
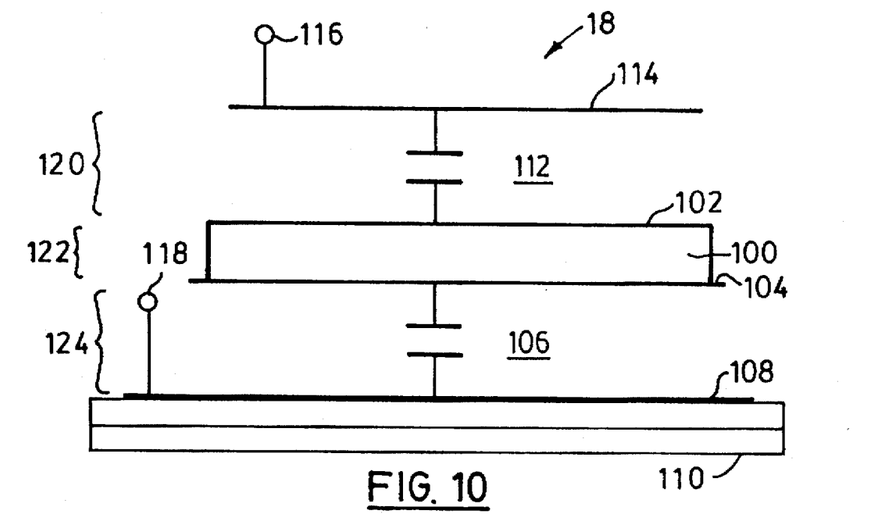
FIG. 10 is a diagrammatic view of a capacitance structure of the kind shown in FIGS. 1 and 2, with a low capacitance layer imbedded between two high capacitance coupling layers.

Reference is next made to FIG. 10, which shows an embodiment of the invention which can help prevent failure of the device caused by penetration of gases or vapors which may be present in the service environment of the capacitance structure. The FIG. 10 embodiment deals with this problem by providing a film capacitance structure 18 which, as shown, can be of mesa form, and which has an embedded dielectric film layer 100 with an electrode 102 above it and another electrode 104 below it. Below electrode 104 is a high capacitance film dielectric layer 106 covering a bottom electrode 108 on an insulated substrate 110. Above electrode 102 is another high capacitance dielectric film layer 112 covered by a top electrode layer 114. Connections 116, 118 are made to the top and bottom electrodes 108, 114 but not to electrodes 102, 104. Thus, three capacitors are formed, indicated at 120, 122, 124. Capacitors 120, 124 provide substantial encapsulation for capacitor 122, helping to protect capacitor 122 from penetration of gases or vapors. In this application, the capacitances formed by capacitors 120, 124 have significantly higher capacitance value than that of capacitor 122, so that the resultant capacitance of the combination (which is connected in series) is dominated by the embedded capacitor 122. For example, if the capacitance of capacitor 122 is C, and the capacitances of upper and lower capacitors 120, 124 are each 10C, then the capacitance $C_{TOTAL}$ of the structure 8 is given by $$\frac{1}{C_{TOTAL}} = \frac{1}{C} + \frac{1}{10C} + \frac{1}{10C} = \frac{12}{10C}.$$

Therefore $C_{TOTAL}$=0.83C, so that as will be apparent, the capacitance of the structure is dominated by that of the middle layer.

Figure 11:
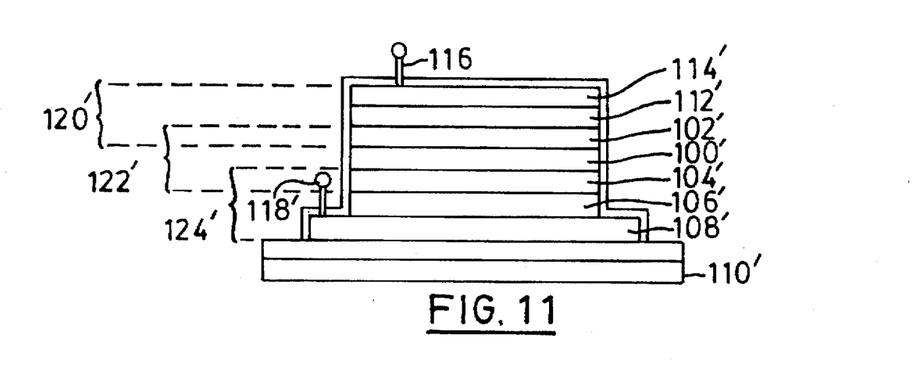
FIG. 11 is a diagrammatic view of a capacitance structure like that of FIG. 10 but with vertical edges instead of a mesa configuration.

If desired, the FIG. 10 embodiment can be constructed as shown in FIG. 11a, where primed reference numerals indicate parts corresponding to those of FIG. 10. In FIG. 11 the upper capacitor 120 and the lower dielectric layer 106 are laterally coextensive with the middle capacitor 122 (since no connection need be made to the middle capacitor 122). This provides somewhat improved protection for the middle capacitor 122.

The difference in capacitances of the various layers can be controlled by using dielectric materials of higher dielectric constant in capacitors 120, 124, and/or by using thinner dielectric layers 106, 112 in these capacitors than in imbedded (middle) capacitor 122. However it will be realized that if multiple capacitors are to be formed on a single substrate, making one layer thinner or thicker in one capacitor will require that the same be done for all capacitors in the substrate, unless multiple re-masking is performed (for different areas on the substrate). Since multiple re-masking can lead to increased defects, it is not normally preferred.

Figure 12:
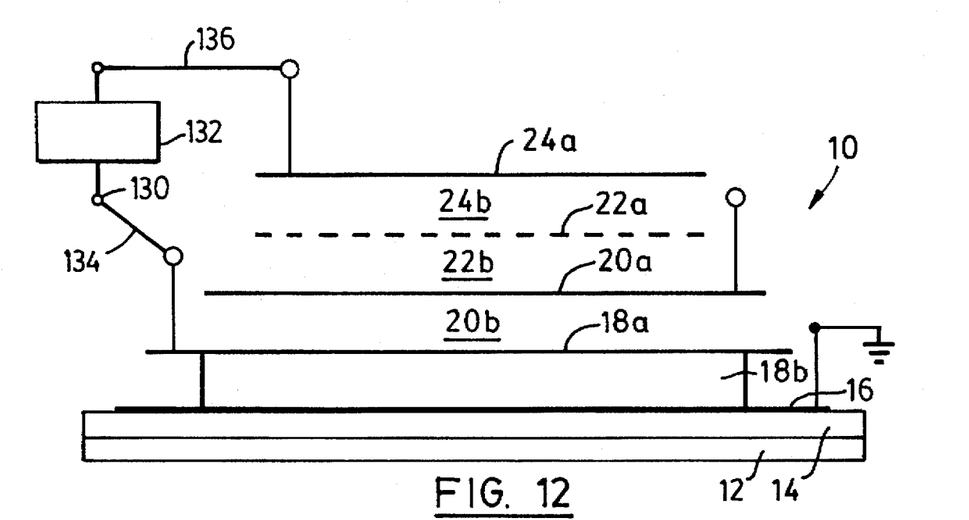
FIG. 12 is a diagrammatic view of the capacitance structure of FIGS. 1 and 2, with a low capacitance lower layer and with the bottom electrode grounded.

Another application of the invention is shown in FIG. 12, for use when the capacitance structure 10 is to be connected to a node 130 of circuit 132, which node is sensitive to parasitic capacitance. In this application, the bottom electrode 16 (which has a parasitic capacitance $C_S$ coupling it to the substrate, as described in connection with FIG. 7a) is grounded. A connection 134 to circuit node 130 is then made from the second electrode 18a. Further connections are made to any other desired electrodes in the capacitor structure, normally including a connection 136 from the top electrode 24a.

While the parasitic sensitive node 130 of the circuit 132 could be connected to the top electrode 24a, in many circuits several nodes are sensitive to parasitics and the top electrode 24a may already be connected to a parasitic sensitive node.

In some cases, the node 130 which is connected to the electrode 18a should not "see" ground through too much capacitance. In that case, the bottom dielectric layer 18b can be made of a low dielectric constant material, or can be made relatively thick, or both, to reduce the capacitance between the second electrode layer 18a and ground.

Figure 13:
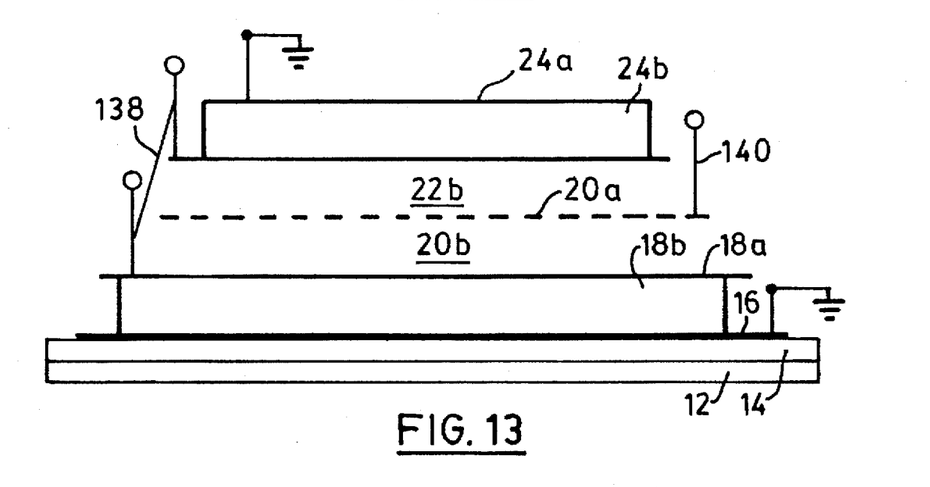
FIG. 13 is a diagrammatic view of the capacitance structure of FIGS. 1 and 2, but with low capacitance lower and upper layers and with the bottom and top electrodes grounded.

Another application of the invention is shown in FIG. 13 and deals with the need to minimize capacitive coupling between a thin film capacitor and adjacent components either integrated on the same substrate or in a multi-chip module arrangement. In the FIG. 13 embodiment, both the bottom and top electrodes 16, 24a are grounded and the remaining intermediate layers are used to constitute the capacitor. Connections 138, 140 are made at any of the intermediate electrodes 18a, 20a, 22a.

Using a low capacitance density material for the bottom and top dielectric layers 18b, 24b helps to reduce the parasitic capacitance to ground of both electrode layers 18a, 22a which may be used to connect to a circuit.

Figure 14A:
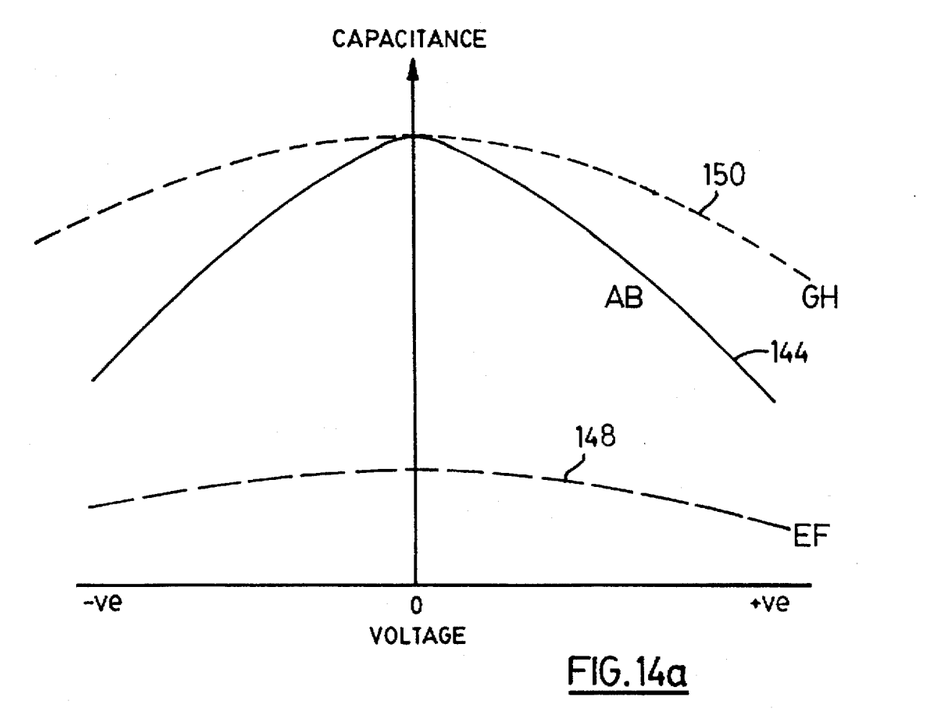
FIGS. 14a to 14d illustrate the scaling effect of a series connected multi-layer capacitor, according to an embodiment of the invention, on capacitance versus DC voltage.
Figure 14B:
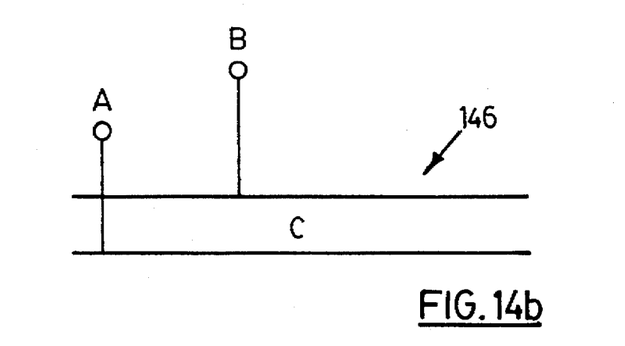

Reference is next made to FIGS. 14a to 14d, which illustrate a problem which occurs in many capacitors, particularly ferroelectric film capacitors. Generally, ferroelectric films have a non-linear voltage dependence as shown by curve 144 for single dielectric layer capacitor 146, i.e. a fairly small change about a center DC voltage V can cause the capacitance to drop off sharply. When the film is thinner, the problem becomes more severe. In most cases, the capacitance-voltage characteristic can be approximated by:

$$C_{146}(V) = C(1 - \alpha V^2)$$

where $C_{146}(V)$ is the capacitance of a single dielectric layer capacitor 146, having electrodes AB, at any applied voltage V; C is the capacitance at zero volts, and $\alpha$ is a constant which depends on the characteristics of the dielectric material, including its thickness.

Figure 14C:
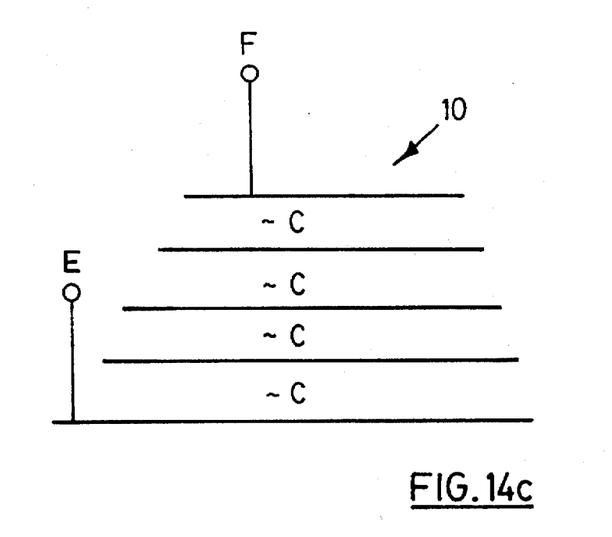

If a four dielectric layer capacitance structure 10 is used as shown in FIG. 14c, then its capacitance $C_{10}(V)$ is given by $C_{10}(V) = C/4(1 - \alpha(V/4)^2)$ where C is the capacitance of each set of layers at zero volts. (In fact, the capacitance of each layer will vary slightly due to the mesa structure, as discussed below.) The resultant curve is shown at 148 in FIG. 14a, and it will be seen that the capacitance $C_{10}(V)$ has much less dependence on applied voltage. However because the capacitors are in series, $C_{10}(V)$ is only one-quarter of $C_{146}(V)$.

Figure 14D:
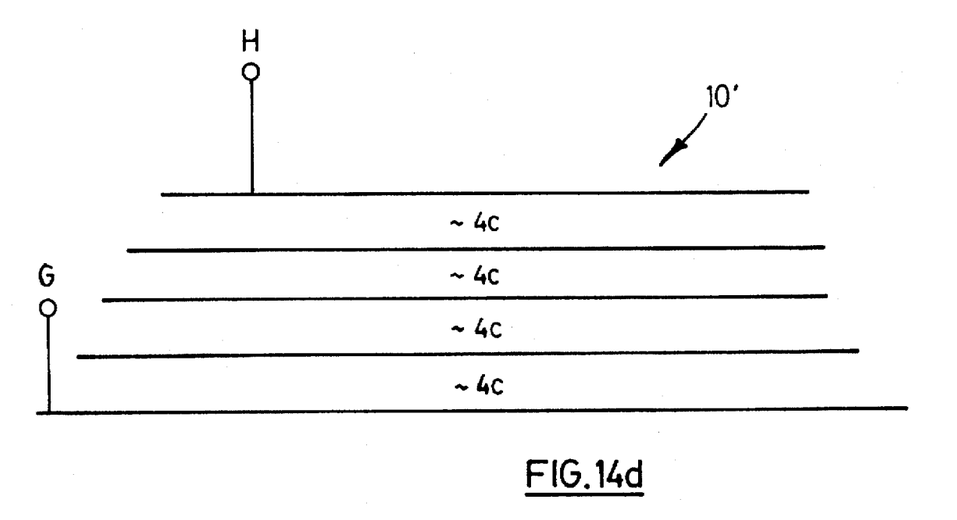

The reduced capacitance can however be dealt with by scaling up the size of the layers of capacitor structure 10, producing capacitor structure 10 as shown in FIG. 14d, where each layer has four times the area of the layers of capacitor 10. The capacitance-voltage curve for this structure is shown at 150 in FIG. 14a, and its capacitance is given by $$C_{10}(V) = C(1 - (\alpha/16)V^2).$$

Thus, the dependence of capacitance on DC voltage, which can be a serious problem with ferroelectric capacitors, can be considerably reduced by making the capacitor in a multi-layer structure and scaling up the size of the individual capacitors in the structure accordingly.

It is noted that while the capacitances of each layer of capacitor 10' have been assumed to be 4C, in fact these capacitances will be slightly different from each other because other areas of the successive layers vary slightly from each other (because of the mesa structure). However the variation is small and can be compensated by adjusting the overall areas to achieve the final desired overall capacitance. Typically the difference in area (and hence capacitance) between adjacent pairs of layers will be in the range of 1% to 20%. For four pairs of layers the difference in areas between the top and bottom pairs of layers will typically be between 4% and 50%. Where the layers are connected in parallel, the difference in areas usually does not matter but if they are in series, the area differences will usually be kept small. While the thicknesses of the dielectric layers can also be changed, it is preferred for ease of manufacture and later customization, that the thicknesses of all dielectric layers on a single substrate be the same (except in special cases such as that of FIGS. 8a, 8b), to avoid multiple re-masking.

While the multi-layer capacitors 10, 10' of FIGS. 14c and 14d have been shown as mesa structures, if desired and since they are connected in series, all of their layers except the bottom layer can be made in a vertical stack with straight sides. However if one capacitor on a substrate is patterned with vertical edges, this would normally have to be done with all the capacitors on the substrate (to avoid multiple repatterning). Therefore the mesa structure is preferred.

Figure 15A:
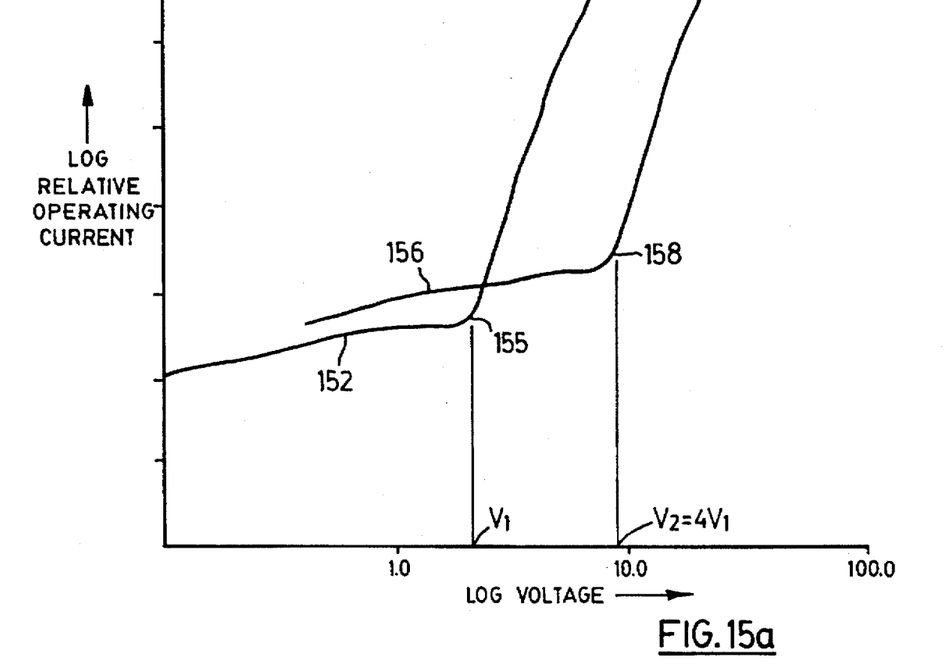
FIGS. 15a to 15d illustrate the scaling effect of series connected multi-layer construction according to the FIGS. 1 and 2 embodiment on leakage current versus voltage relation.
Figure 15B:
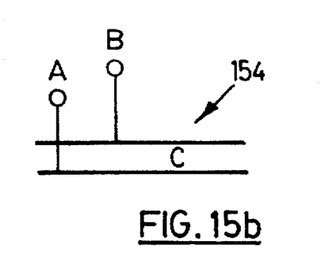

Reference is next made to FIGS. 15a to 15d, which deal with the leakage current problem. In most capacitors, a leakage current begins at a given applied voltage and increases as the applied voltage increases. FIG. 15a shows at 152 a typical relative operating current (or leakage current) versus applied voltage curve for a single dielectric layer capacitor 154 which is shown in FIG. 15b and has capacitance C. A log-log scale is used in FIG. 15a. It will be seen that significant operating current begins at point 155, at applied voltage value V1, and increases rapidly from that point. (Below voltage V1 the leakage current density is typically less than $10^{-8}$ amperes/cm$^2$.)

Figure 15C:
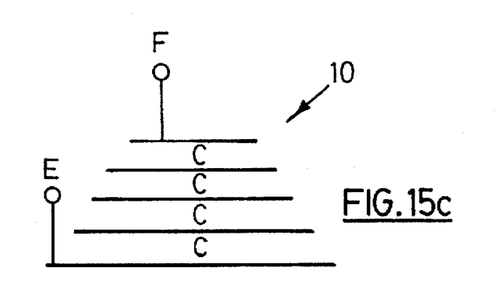

When a multi-layer capacitance structure 10 is used, as shown in FIG. 15c, having for example four dielectric layers, then the operating voltage is divided among all the layers and the electric field across each is scaled down by N, where N is the number of dielectric layers. In general, provided that random defects do not dominate the leakage across any layer, the current versus applied voltage relationship will scale approximately by a factor of N on the voltage scale with respect to single layer behaviour. It is assumed that the capacitance of each of the four capacitors formed by structure 10 is approximately C. The relative operating current for structure 10 will therefore begin to increase sharply only beyond a higher threshold value of applied voltage.

Figure 15D:
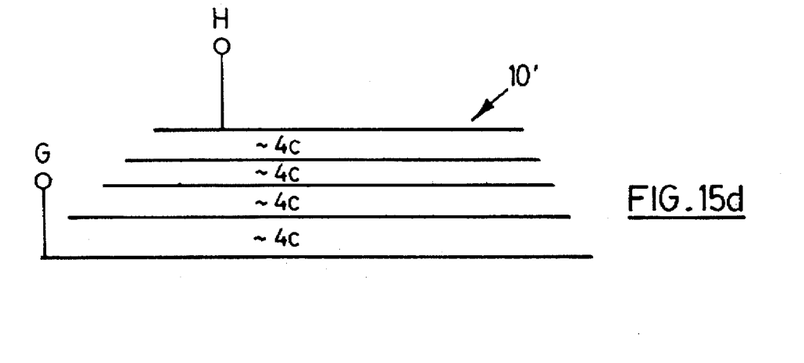

Although the capacitance value also reduces as the number of layers increases (since the layers are connected in series), the size and hence the capacitance value of each layer can be scaled upwardly as shown at 10' in FIG. 15d to compensate for this proportionately. In FIG. 15d each layer is assumed to have four times the area of the layers in FIG. 15c. The relative operating current, indicated by curve 156 in FIG. 15a, has a shape similar to that of curve 152, i.e. it increases slowly to threshold point 158 and then increases steeply thereafter. Point 158 occurs at a voltage V2 which is four times higher than voltage V1 for four layers. (The thickness of the dielectric layers could also be reduced to increase the capacitance, but it would be undesirable solely to use this approach, partly because it may further increase the leakage current, and partly because, as mentioned, this would require that all other capacitors on the substrate receive the same treatment if multiple re-masking is to be avoided.)

It will be seen from FIG. 15a that where the applied voltage V is less than V1, the leakage or relative operating current of capacitor 10' is slightly higher than that of capacitor 154, but it is only slightly higher (it is in the same decade).

However when applied voltage V is between V1 and V2, the leakage or operating current can be zero to 4 decades (orders of magnitude) less for capacitor 10' than for capacitor 154. This is because the series connected capacitor C10' has not yet reached the high leakage voltage threshold V2=4V1.

Even when the applied voltage V is greater than V2, the leakage or operating current for capacitor 10' can remain (in the example given) about 4 decades below that for capacitor 154 (for the same applied voltage V) when the current voltage relationship is superlinear, as in the example given for FIG. 15a. In this example, the area scale-up in capacitor 10' does not fully offset the advantageous superlinear reduction in operating current.

It will be realized that it is possible to optimize between leakage current and capacitance value for a series connected capacitance structure by choosing how many layers to connect.

Figure 16:
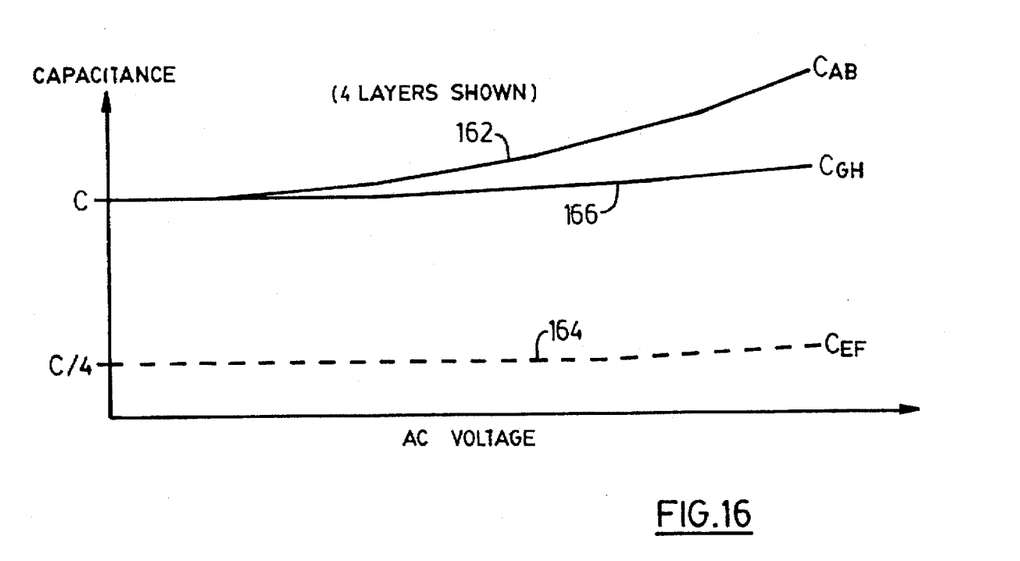
FIG. 16 illustrates for the capacitances of FIGS. 15b to 15d the effect of an AC signal voltage on capacitance.

It is also known that large AC signals can vary the capacitance of most ferroelectric thin film capacitors, as shown in FIG. 16 where capacitance is plotted on the vertical axis and AC voltage on the horizontal axis. In FIG. 16 curve 162 shows the variation of capacitance with applied AC signal voltage for a typical single dielectric layer ferroelectric film capacitor. Curve 164 shows the variation of capacitance with AC signal when the structure 10 of FIG. 15c is used. As before, because the applied voltage is divided between the layers used, this results in a capacitance versus AC voltage curve 164 which is relatively linear for the illustrated range. Since the layers are connected in series, the total capacitance for curve 164 is only one quarter that for curve 162 at zero volts. As before, this is dealt with by scaling up the area of the capacitor layers as shown for structure 10' of FIG. 15d, resulting in curve 166 of FIG. 16a. Curve 166 is considerably more linear than curve 162.

Figure 17:
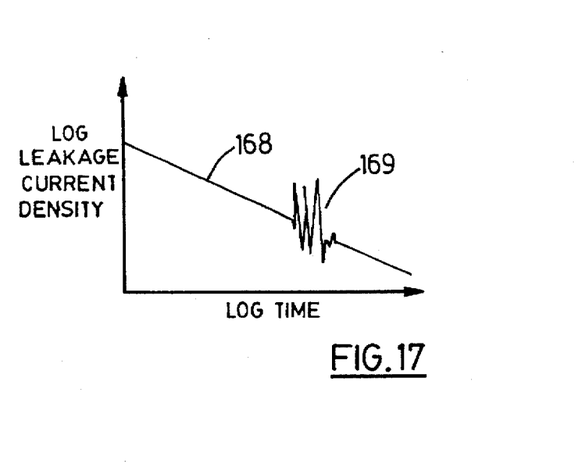
FIG. 17 is a plot illustrating time dependent dielectric breakdown.

A further advantage of using a multi-layer capacitor structure as shown in FIG. 15d relates to a phenomenon called time dependent dielectric breakdown (TDDB). This is illustrated in FIG. 17, which plots (on a log-log scale) leakage current density versus time for a single layer capacitor. Normally the leakage current density decreases with time, as indicated by line 168, as the dielectric builds up charge. However bursts of leakage current sometimes occur, indicated at 169. These somewhat unpredictable bursts, which cause circuit noise or worse, can be caused by various factors, e.g. spatially random point defects, local point heating causing thermal breakdown at that point, local accumulations of charge carriers, and moisture increase. The use of multi-layers, scaled up in area, reduces the effects of TDDB since if TDDB occurs at different times in different layers, the magnitude of each noise burst created will be less (since there may be TDDB in one layer but not in the other layers).

Figure 18A:
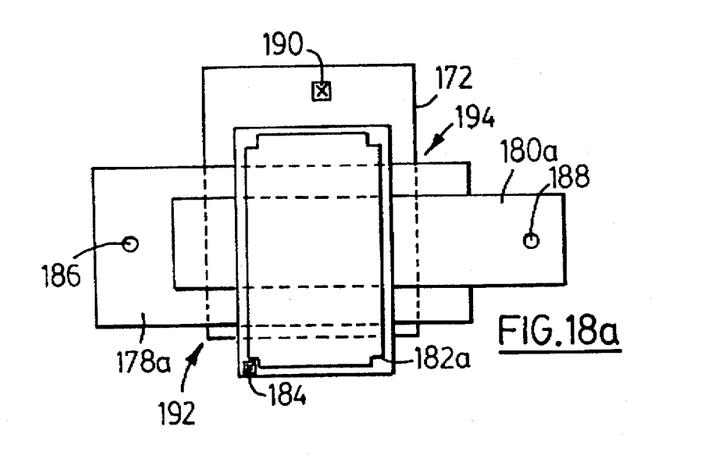
FIG. 18a is a top view of an alternative embodiment of the invention, using staggered layers rather than mesa geometry.
Figure 18B:
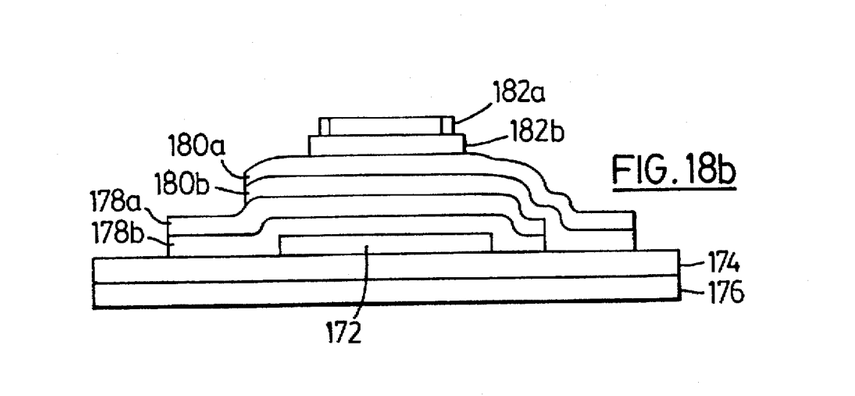

Reference is next made to FIGS. 18a and 18b, which show a modified multi-layer capacitance structure 170. The capacitance structure 170 differs from that shown in FIGS. 1 and 2 in that it is not a mesa structure, but instead is of staggered construction, having a bottom electrode 172 formed on insulation 174 covering a substrate 176, and three additional pairs of an electrode layer/dielectric layer 178a, 178b, 180a, 180b and 182a, 182b located atop electrode 172.

In the staggered arrangement shown in FIGS. 18a, 18b, each electrode 172, 178a, 180a, 180b is brought out horizontally away from the remaining layers so that circuit connections can be made to each electrode as indicated at 184, 186, 188, 190. The materials used are the same as those shown in the preceding embodiments, namely film conductors and film dielectric layers laid down by known deposition techniques. It will be apparent that the FIGS. 18a, 18b embodiment must be built by bottom-up fabrication, rather than by top-down patterning, since upper layers project beyond lower layers in the FIGS. 18a, 18b embodiment.

The FIGS. 18a, 18b embodiment, like those of the preceding embodiments, has the advantage that circuit connections can be made to any or all of the electrode layers as desired. However a disadvantage of the FIGS. 18a, 18b embodiment is that corners, such as those indicated at 192, 194 can be uneven and difficult to deposit on; some areas can be too thick for suitable adhesion; the locations which can be used for contact areas are restricted (as compared with the mesa structure where contacts can be applied at any location around the periphery of each electrode layer); and there can be increased parasitic capacitance problems.

While preferred embodiments of the invention have been described, it will be appreciated that various changes can be made within the scope of the appended claims.

I claim:

1. A multi-layer capacitance structure formed on a substrate and comprising:
    (a) a bottom film electrode layer overlying said substrate,
    (b) at least one pair of intermediate layers of a film electrode and a film dielectric material overlying said bottom electrode,
    (c) a top pair of layers of a film electrode and a film dielectric material overlying the uppermost pair of intermediate layers,
    (d) said bottom electrode having a connection portion extending laterally beyond the intermediate layers, said connection portion having a first upper surface, said first upper surface including means adapted to be connected to a circuit,
    (e) at least one electrode of said intermediate layers having a connection portion extending laterally beyond the layers above it, said connection portion having a second upper surface, said second upper surface including means adapted to be connected to a circuit,
    (f) said top electrode layer having a third upper surface, said third upper surface including means adapted to be connected to a circuit,
    (g) said layers being arranged in a mesa structure, so that said at least one pair of intermediate layers extends laterally beyond said top layers around the entire periphery of said top layers, and said bottom electrode extends laterally beyond said at least one pair of intermediate layers around the entire periphery of said intermediate layers.

2. A capacitance structure according to claim 1 wherein there are a plurality of pairs of said intermediate layers, and wherein in each of a plurality of said pairs of intermediate layers, the electrode layer thereof extends laterally beyond the periphery of all intermediate layers thereabove.

3. A capacitance structure according to claim 1 or 2 wherein said dielectric material is a ferroelectric material.

4. A capacitance structure according to claim 1 or 2 wherein each pair of layers forms, with the electrode layer of an adjacent pair, a capacitor, and wherein a plurality of said capacitors in said capacitance structure are parallel connected.

5. A capacitance structure according to claim 1 to 2 wherein at least some of said dielectric layers have dielectric constants different from others of said dielectric layers.

6. A capacitance structure according to claim 1 to 2 wherein at least some of said dielectric layers have different frequency response characteristics from others of said dielectric layers.

7. A capacitance structure according to claim 2 wherein said bottom electrode is not connected to any circuit, and the electrode layer of at least one of said intermediate pairs is connected to a circuit, thereby to reduce the effect on said last mentioned circuit of parasitic capacitances between said bottom electrode and said substrate.

8. A capacitance structure according to claim 7 wherein said bottom electrode forms with the dielectric layer next to said bottom electrode layer and with the electrode layer next to said last mentioned dielectric layer a capacitor of lower value than the value of the capacitances formed by at least some of the remaining layers in said structure.

9. A capacitance structure according to claim 2 wherein said top and bottom electrode layers are connected to ground.

10. A capacitance structure according to claim 9 wherein said top and bottom electrode layers form with their adjacent dielectric layers and with the electrode layers next to said adjacent dielectric layers, top and bottom capacitors, said top and bottom capacitors being of lower capacitance value than the value of the capacitances formed by at least some of the remaining layers in said structure.

11. A capacitance structure according to claim 1 or 2 wherein said layers define at least three capacitors, namely a lower capacitor, an upper capacitor, and an intermediate capacitor between said lower and upper capacitors, said intermediate capacitor being of substantially smaller capacitance value than said upper and lower capacitors and being protected from environmental influences by said upper and lower capacitors, said upper, lower and intermediate capacitors being arranged in series with said upper and lower capacitors including means adapted to be connected to a circuit.

12. A multi-layer capacitance structure comprising:
 (1) a substrate,
 (2) a plurality of separate capacitor structures formed on said substrate,
 (3) each capacitor structure comprising:
  (a) a bottom film electrode layer overlying said substrate,
  (b) at least one pair of intermediate layers of a film electrode and film dielectric material overlying said bottom electrode,
  (c) a top pair of layers of a film electrode and a film dielectric material overlying the uppermost pair of intermediate layers,
  (d) said bottom electrode having a connection portion extending laterally beyond the intermediate layers, said connection portion having a first upper surface, said first upper surface including means adapted to be connected to a circuit,
  (e) at least one electrode of said intermediate layers having a connection portion extending laterally beyond the layers above it said connection portion having a second upper surface, said second upper surface including means adapted to be connected to a circuit,
  (f) said top electrode layer having a third upper surface, said third upper surface including means adapted to be connected to a circuit,
  (g) said layers being arranged in a mesa structure, so that said at least one pair of intermediate layer extends laterally around said top layers around the entire periphery of said top layers, and said bottom electrode extends laterally beyond said at least one pair of intermediate layers around the entire periphery of said intermediate layers.

13. A capacitance structure according to claim 12 wherein at least some of the electrode layers of each capacitance structure correspond in position above said substrate to the position above said substrate of electrode layers of others of said capacitance structures, the thickness of corresponding electrode layers in said capacitance structures all being the same.

14. A capacitance structure according to claim 13 wherein at least some of the dielectric layers of each capacitance structure correspond in position above said substrate to the position above said substrate of dielectric layers in others of said capacitance structures, the thickness of corresponding dielectric layers in said capacitance structures all being the same.

15. A capacitance structure according to claim 14 wherein said film dielectric material is a ferroelectric material.

16. A capacitance structure according to any of claims 12, 13, 14 or 15 and including connections between at least two of said capacitance structures.

17. A capacitance structure according to any of claims 12, 13, 14 or 15 and being formed by deposition of said electrode layers and said film dielectric on said substrate, and then by top-down patterning of said electrode layers and said film dielectric to form said plurality of said capacitance structures on said substrate.

* * * * *

UNITED STATES PATENT AND TRADEMARK OFFICE
CERTIFICATE OF CORRECTION

PATENT NO. : 5,745,335
DATED : April 28, 1998
INVENTOR(S) : Watt, Michael Man-Kuen It is certified that error appears in the above-identified patent and that said Letters Patent is hereby corrected as shown below:

In claim 5, line 1, delete "1 to 2" and substitute --1 or 2--.

In claim 6, line 1, delete "1 to 2" and substitute --1 or 2--.

Signed and Sealed this

Fifth Day of December, 2000

Attest:

Q. TODD DICKINSON

Attesting Officer

Director of Patents and Trademarks